United States Patent [19]

Gailus et al.

[11] Patent Number: 5,239,693
[45] Date of Patent: Aug. 24, 1993

[54] AMPLIFIER LEVEL-SETTING APPARATUS

[75] Inventors: Paul H. Gailus, Prospect Heights; William J. Turney, Schaumburg; Francis R. Yester, Arlington Heights, all of Ill.

[73] Assignee: Motorola, Inc., Schaumburg, Ill.

[21] Appl. No.: 606,679

[22] Filed: Oct. 31, 1990

[51] Int. Cl.[5] .............................. H04B 1/04
[52] U.S. Cl. ................... 455/115; 455/126; 455/127; 330/2
[58] Field of Search ............... 455/62, 115, 117, 127, 455/67, 67.3, 126; 330/207 P, 289, 291, 298, 100, 2, 144, 145, 284

[56] References Cited

U.S. PATENT DOCUMENTS

| | | | |
|---|---|---|---|
| 3,702,970 | 11/1972 | Stetzler | 330/2 |
| 3,891,933 | 6/1975 | Suzuki et al. | 230/2 |
| 4,019,150 | 4/1977 | Lurey et al. | 330/2 |
| 4,114,108 | 9/1978 | Faulkenberry et al. | 455/127 |
| 4,313,210 | 1/1982 | Hume et al. | 455/127 |
| 4,849,713 | 7/1989 | Botti et al. | 330/2 |
| 4,870,699 | 9/1989 | Garner et al. | 455/62 |
| 4,939,786 | 7/1990 | McCallum et al. | 455/115 |

Primary Examiner—Reinhard J. Eisenzopf
Assistant Examiner—Edward Urban
Attorney, Agent, or Firm—Wayne J. Egan

[57] ABSTRACT

An amplifier level-setting apparatus is provided for obtaining the maximum power output and highest efficiency allowable for a predetermined level of distortion. According to the invention, a training signal is applied to the input of the amplifier prior to the desired signal. The training signal level is increased while the output distortion is measured. When the output distortion level reaches a predetermined limit, the corresponding training signal input level is saved. The input signal level is then adjusted to this saved level value, thereby resulting in the maximum amplifier output level possible that is still within the distortion limit.

25 Claims, 2 Drawing Sheets

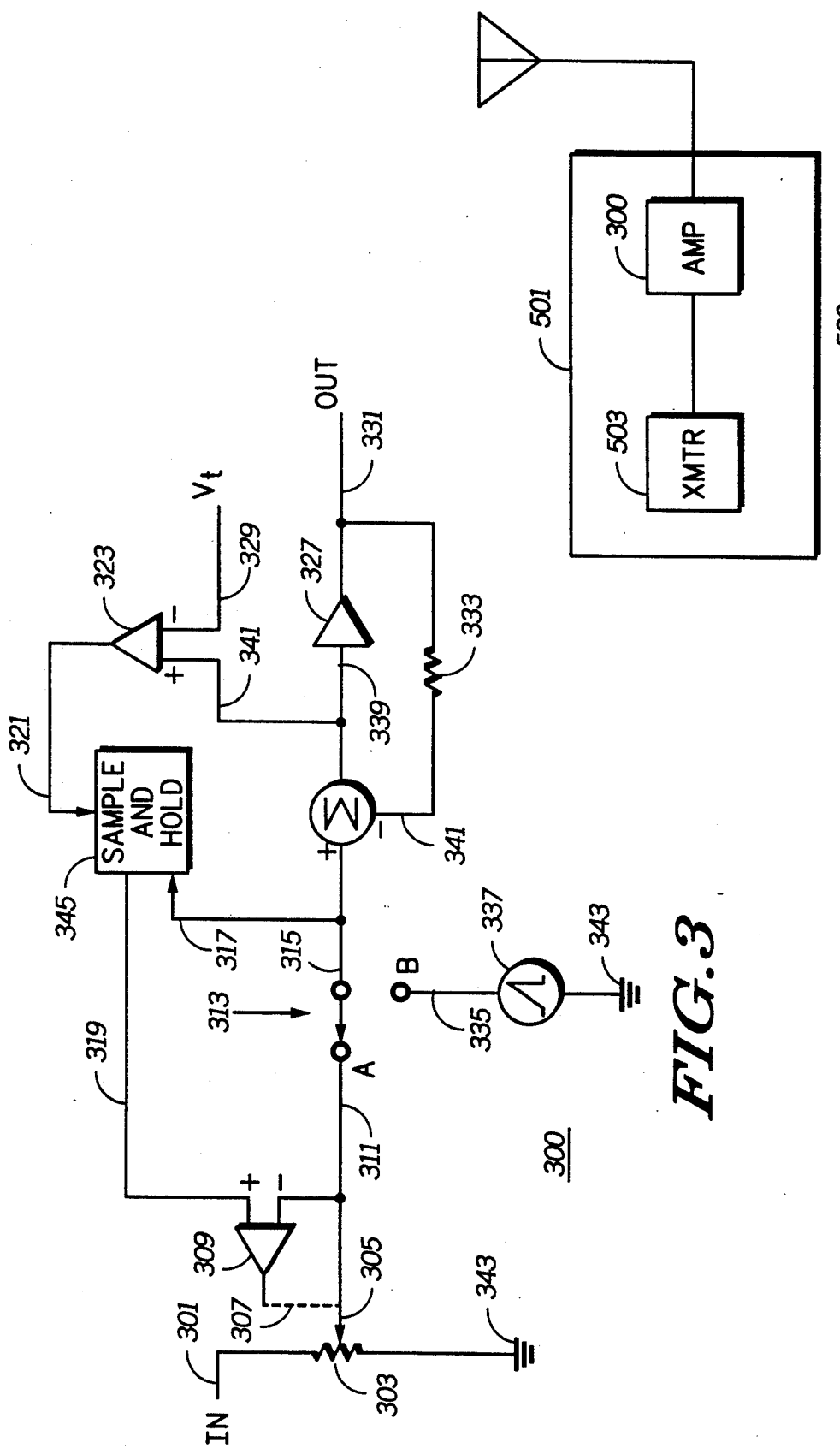

ary to the invention.

AMPLIFIER LEVEL-SETTING APPARATUS

TECHNICAL FIELD

This application relates to a method and apparatus for adjusting the input level in a power amplifier.

BACKGROUND OF THE INVENTION

In order to improve the spectral efficiency of radio products, transmitter modulating schemes which produce a variable RF envelope are becoming increasingly common. In order to minimize off-channel splatter with these modulation schemes and still maintain acceptable RF power amplifier (PA) efficiencies, a number of PA linearization schemes have been developed.

FIG. 1 is a typical input-output characteristic of a power amplifier, as in the prior art. There is shown an X-Y plot, with the abscissa (X-axis) representing the input voltage and the ordinate (Y-axis) representing the output voltage. The curve 101 represents the relationship of the $V_{output}$ (Y-axis) to the $V_{input}$ (X-axis) for a typical amplifier. The curve 101 includes three portions, a first linear portion 105, a clipping portion 109, and a non-linear transitional portion 107. Those skilled in the art will appreciate that the output distortion corresponding to an operating point in the linear portion 105 is low, and increases as the operating point moves from the linear portion 105 to the transition portion 107. In order to maximize the efficiency of the amplifier, therefore, it is desirable to operate at the point on the curve 101 corresponding to largest possible value of $V_{out}$, while still achieving an acceptable value of output distortion. For a low value of distortion, this operating point is represented as point 113 on curve 101. As shown, point 113 corresponds to an input of $V_A$ and an output of $V_B$, and is situated at the junction of the linear portion 105 and the non-linear transitional portion 107. If more distortion were allowable, of course, then operating point 113 could be moved into the transitional portion 107, thereby providing a larger $V_B$. The problem addressed by the invention, then, is—for a given level of distortion—how to set amplifier input level $V_A$ resulting in the highest possible output $V_B$ so that power output and efficiency are maximized.

SUMMARY OF THE INVENTION

It is an object of the invention to provide an improved method and apparatus for obtaining the highest levels of power amplifier output power and efficiency for a given amount of distortion. Therefore, an amplifier level-setting apparatus is provided. According to the invention, a training signal is applied to the input of the amplifier prior to the desired signal. The training signal level is slowly increased while the output distortion is measured. When the output distortion level reaches a predetermined limit, the corresponding training signal input level is saved. The input signal level is then adjusted to this saved level value, thereby resulting in the maximum amplifier output level possible that is still within the distortion limit.

BRIEF DESCRIPTION OF THE DRAWINGS

FIG. 3 is a block diagram of a first embodiment of a power amplifier equipped with an amplifier level-setting apparatus, according to the invention.

FIG. 5 is a block diagram of a radio equipped with a transmitter and a power amplifier equipped with a level-setting apparatus, according to the invention.

DETAILED DESCRIPTION OF THE INVENTION

Figure 2:
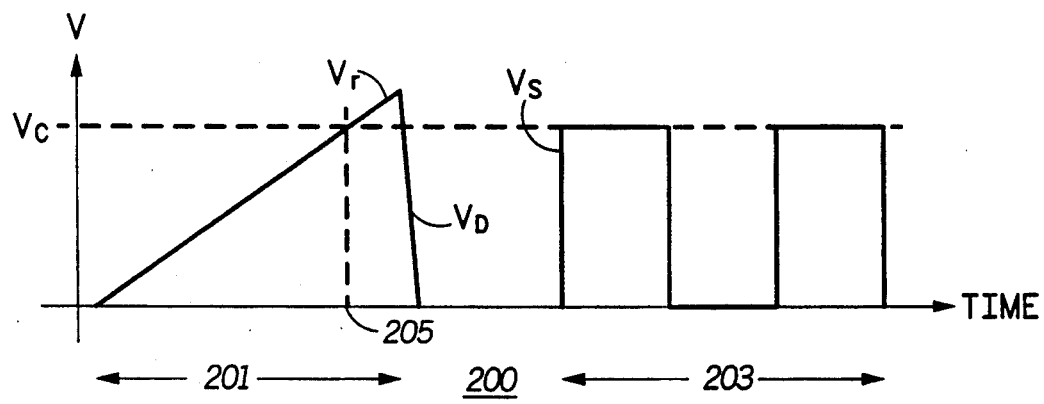
FIG. 2 is a voltage-vs.-time diagram of a training waveform, according to the invention.

FIG. 2 is a voltage-vs.-time diagram of a training sequence, according to the invention. Because of inaccuracies in component gains due to manufacturing tolerances and variations in temperature, power amplifier loading, and supply voltage, the only reliable method of determining the amplifier clip level is to actually allow clip to occur during a training interval 201 prior to the interval 203 during which the desired information is sent. In the present invention, the training sequence applies a voltage ramp $V_r$ to the amplifier input until a clipping condition is detected at time 205. At this point 205, the input level $V_C$ which just caused the clip condition is stored and the input signal is decayed with down ramp $V_D$. The following information signal $V_s$ is then scaled so that it is always less than the stored value $V_C$ that caused clip.

In a digital signal processor (DSP) environment, one way of implementing this level-setting algorithm would be to generate the training ramp at the amplifier input with a DSP, and then use the digital value at the corresponding D/A input as the value to store when clip is detected. A problem with this technique is that the digital value so obtained differs from the corresponding analog value which caused clip because of intervening time delays. These time delays are incurred from the sampling rate and the post-D/A reconstruction filters. Ideally, adding a corresponding amount of delay to time shift the digital value would correct this problem, but a large part of the delay is from analog filters and hence is not very reproducible or stable. Slowing down the rate of change of the training ramp will reduce the time delay problem, but this would lengthen the training interval unacceptably for many systems.

FIG. 3 is a block diagram of a first embodiment of an amplifier level-setting apparatus, according to the invention. There is shown a power amplifier 327 with output 331 and input 339. As shown, part of the output 331 is fed back to amplifier input 339 via resistor 333, lead 341, and summing device 325. The input 339 may be connected either to signal input 301 or to training signal generator 337 under control of switch 313. Switch 313 has two positions, A and B.

With switch 313 in position A, amplifier input 339 is connected to input signal 301 via summing device 325, lead 311 and level control unit 303. As shown, level control unit 303 is depicted as a potentiometer connected to ground 343, with the signal attenuation—corresponding to the position of wiper arm 305—controlled by lead 307. As shown, lead 307 is controlled by comparator 309, which compares the level of signal 311 to the level of signal 319. Thus, with switch 313 in position A, comparator 309 and potentiometer 303 interact so that the input signal 301 is scaled to achieve a level at 311 equal to the level at 319. The signal on lead 311 is then applied to the input 339 of amplifier 327 via summing device 325.

With switch 313 in position B, amplifier input 339 is connected to ramp generator 337 via summing device 325 and lead 335.

The training process is as follows:

With switch 313 in position B, and during the training time 201, generator 337 applies ramp signal $V_r$ (shown in FIG. 2) to input 339 via summing device 325. The rate of change of the ramp signal $V_r$ is preferably less than the maximum rate of change of the information signal $V_S$ of FIG. 2. to minimize off channel splatter. With $V_r$ at a small value near zero, amplifier 327 operates within the linear portion 105 of its characteristic 101. In this linear mode, negative feed-back occurs by virtue of resistor 333 and summing device 325, and so the output of device 325 is small, near zero. During the training time 201, the corresponding plot of the signal on lead 339-vs.-time is shown in FIG. 4.

Figure 4:
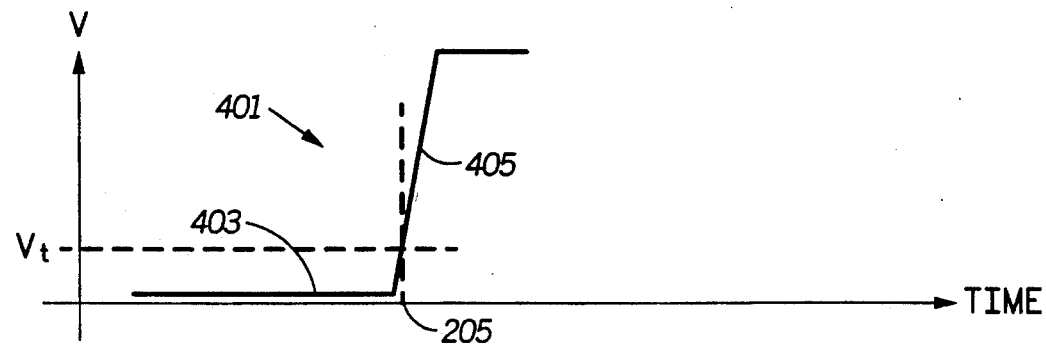
FIG. 4 is a voltage-vs.-time diagram of an error waveform, according to the invention.

Referring now to FIGS. 2 and 4, it is seen that as $V_r$ increases to $V_C$, the amplifier 327 remains within the linear portion of its characteristic 105 and, as a result, signal 339 is held to a low value 403. As Vr increases, however, the amplifier's operating point moves up the linear region 105 and towards its non-linear clipping region 109. Ultimately, as the $V_r$ signal level continues increasing, amplifier 327's operating point will leave the linear region 105 and enter the non-linear portion 107. When this occurs, near time 205, the voltage 339 will increase dramatically. This is shown in FIG. 4, where as time nears the point 205, the voltage 339 departs from its near-constant level 403, and begins increasing sharply with the sharp ramp 405.

Figure 1:
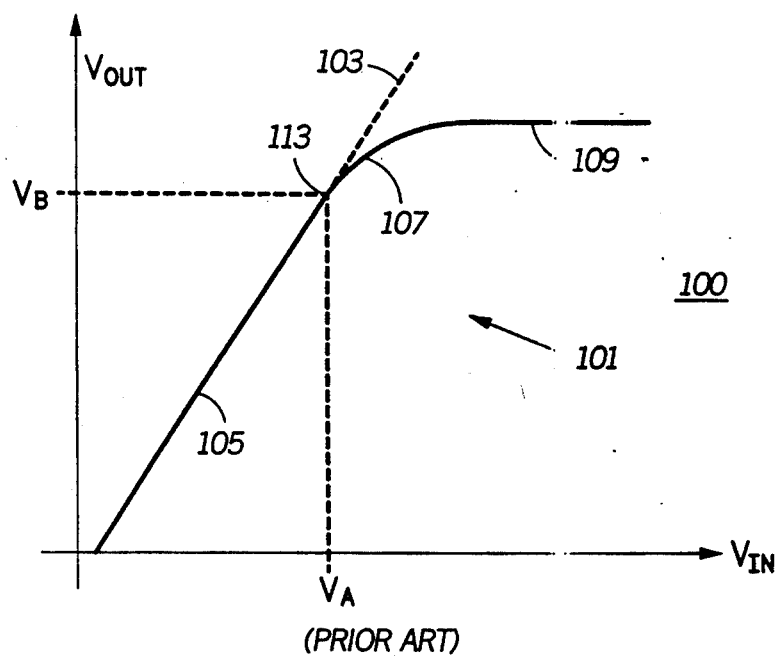
FIG. 1 is a typical input-output characteristic of a power amplifier, as in the prior art.

As the voltage 339 crosses a pre-set threshold $V_t$, it causes comparator 323 to output a pulse to sample-and-hold device 345. This causes device 345, in turn, to latch, or capture, the current voltage level of signal $V_r$ via lead 317. This level corresponds to voltage $V_C$, shown in FIG. 2, and also to voltage $V_A$, shown in FIG. 1.

It will be obvious to those skilled in the art that the key to measuring $V_C$ is determining when the amplifier 327 begins to depart from its linear operating region 105 and begins to enter its non-linear operating region 107. As long as amplifier 327 is in the linear region 105, then the negative feedback provided by path 333 acts to keep the voltage at input 339 at a low value. When the non-linear region 107 is entered, however, path 333 no longer provides negative feedback, and so the voltage at input 339 is permitted to grow at a different rate with respect to time. Thus, the slope (dv/dt) of input signal 339 will change at this point. Thus, instead of using a comparator 323 to measure the threshold voltage crossing of $V_t$, an alternate embodiment would utilize a slope detector to measure the change in slope (dv/dt) of the input signal 339 to detect the point in time 205, and the corresponding level $V_C$ of ramp signal $V_r$, corresponding to amplifier 327's transition from its linear region 105 to its non-linear region 107.

The stored voltage level $V_C$ is now applied to comparator 309 via lead 319. With input 301 set to the maximum level of the desired information signal, comparator 309 now interacts with potentiometer 303 to adjust the fraction of input signal 301 present at lead 311 so that it is equal to the saved voltage $V_C$. Switch 313 is then returned to position A prior to interval 203 so that the amplifier is then responsive to the desired signal input, 301, corresponding to $V_S$ in FIG. 2. Since $V_C$ (shown in FIG. 2) is equal to $V_A$ (shown in FIG. 1), this means the amplifier 327 is operating at or near its optimum operating point 113.

Referring now to FIG. 3, it is obvious the level-adjusting device 303 could be realized by a step attenuator.

FIG. 5 is a block diagram of a radio 501 equipped with a transmitter 503 and a power amplifier equipped with a level-setting apparatus, according to the invention. As shown, the power amplifier equipped with level-setting apparatus is the first embodiment 300 of FIG. 3.

While various embodiments of an amplifier level-setting apparatus, according to the present invention, have been described hereinabove, the scope of the invention is defined by the following claims.

What is claimed is:

1. In an amplifier having an input, an output, a linear region of operation, and a non-linear region of operation, a negative feedback path connecting the amplifier output to a first input of a summing device, the output of the summing device coupled to the amplifier input, a method for adjusting the amplifier input signal level so the amplifier output is at the maximum possible level thereby maximizing the amplifier efficiency while still operating in the linear region of operation, the method comprising the steps of:

(a) applying a signal to a second input of the summing device, at a level where the amplifier operates in the linear region;

(b) increasing the input signal level, while monitoring the voltage at the amplifier input;

(c) determining when the amplifier output starts to become non-linear;

(d) determining the input signal level corresponding to step (c);

(e) thereafter controlling the input signal to maintain its maximum level at the level determined in step (d).

2. The method of claim 1 where step (b) is performed using a ramp generator.

3. The method of claim 1 where step (c) is performed using a voltage comparator.

4. The method of claim 1 where step (d) is performed using a sample and hold device.

5. The method of claim 1 where step (e) is performed using a step attenuator.

6. In an amplifier having an input, an output, a linear region of operation, and a non-linear region of operation, a negative feedback path connecting the amplifier output to a first input of a summing device, the output of the summing device coupled to the amplifier input, a method for adjusting the amplifier input signal level so the amplifier output is at the maximum possible level thereby maximizing the amplifier efficiency, while still operating in the linear region of operation, the method comprising the steps of:

(a) applying a signal to a second input of the summing device, at a level where the amplifier operates in the linear region;

(b) increasing the input signal level, while monitoring the slope (dv/dt) of the voltage at the amplifier input;

(c) determining when the slope at the amplifier input equals a predetermined value, the predetermined value corresponding to when the amplifier output starts to become non-linear;

(d) determining the input signal level corresponding to step (c);

(e) thereafter controlling the input signal to maintain its maximum level at the level determined in step (d).

7. In a radio having an RF transmitter power amplifier having an input, an output, a linear region of operation, and a non-linear region of operation, a negative feedback path connecting the amplifier output to a first input of a summing device, the output of the summing device coupled to the amplifier input, a method for adjusting the amplifier input signal level so the amplifier output is at the maximum possible level while still operating in the linear region of operation, the method comprising the steps of:
  (a) applying a signal to a second input of the summing device, at a level where the amplifier operates in the linear region;
  (b) increasing the input signal level, while monitoring the voltage at the amplifier input;
  (c) determining when the amplifier output starts to become non-linear;
  (d) determining the input signal level corresponding to step (c);
  (e) thereafter controlling the input signal to maintain its maximum level at the level determined in step (d).

8. The method of claim 7 where step (b) is performed using a ramp generator.

9. The method of claim 7 where step (c) is performed using a voltage comparator.

10. The method of claim 7 where step (d) is performed using a sample and hold device.

11. The method of claim 7 where step (e) is performed using a step attenuator.

12. In a radio having an RF transmitter power amplifier having an input, an output, a linear region of operation, and a non-linear region of operation, a negative feedback path connecting the amplifier output to a first input of a summing device, the output of the summing device coupled to the amplifier input, a method for adjusting the amplifier input signal level so the amplifier output is at the maximum possible level while still operating in the linear region of operation, the method comprising the steps of:
  (a) applying a signal to a second input of the summing device, at a level where the amplifier operates in the linear region;
  (b) increasing the input signal level, while monitoring the slope (dv/dt) of the voltage at the amplifier input;
  (c) determining when the slope at the amplifier input equals a predetermined value, the predetermined value corresponding to when the RF transmitter power amplifier output starts to become non-linear;
  (d) determining the input signal level corresponding to step (c);
  (e) thereafter controlling the input signal to maintain its maximum level at the level determined in step (d).

13. An amplifier having an input, an output, a linear region of operation, and a non-linear region of operation, a negative feedback path connecting the amplifier output to a first input of a summing device, the output of the summing device coupled to the amplifier input, and adjusting means for adjusting the amplifier input signal level so the amplifier output is at the maximum possible level thereby maximizing the amplifier efficiency while still operating in the linear region of operation, the adjusting means comprising:
  means for applying a signal to a second input of the summing device, at a level where the amplifier operates in the linear region;
  means for increasing the input signal level and monitoring the voltage at the amplifier input;
  first determining means for determining when the amplifier output starts to become non-linear;
  second determining means for determining the input signal level corresponding to when the amplifier output starts to become non-linear; and,
  means for controlling the input signal to maintain its maximum level at the level corresponding to when the amplifier output starts to become non-linear.

14. The amplifier of claim 13 where the increasing means includes a ramp generator.

15. The amplifier of claim 13 where the first determining means includes a voltage comparator.

16. The amplifier of claim 13 where the second determining means includes a sample and hold device.

17. The amplifier of claim 13 where the controlling means includes a step attenuator.

18. An amplifier having an input, an output, a linear region of operation, and a non-linear region of operation, a negative feedback path connecting the amplifier output to a first input of a summing device, the output of the summing device coupled to the amplifier input, and adjusting means for adjusting the amplifier input signal level so the amplifier output is at the maximum possible level thereby maximizing the amplifier efficiency, while still operating in the linear region of operation, the adjusting means comprising:
  means for applying a signal to a second input of the summing device, at a level where the amplifier operates in the linear region;
  means for increasing the input signal level, while monitoring the slope (dv/dt) of the voltage at the amplifier input;
  means for determining when the slope at the amplifier input equals a predetermined value, the predetermined value corresponding to when the amplifier output starts to become non-linear;
  means for determining the input signal level corresponding to when the slope at the amplifier input equals a predetermined value;
  means for controlling the input signal to maintain its maximum level at the input signal level corresponding to when the slope at the amplifier input equals a predetermined value.

19. A radio including an RF transmitter power amplifier having an input, an output, a linear region of operation, and a non-linear region of operation, the RF transmitter power amplifier including means for adjusting the RF transmitter power amplifier input signal level so the RF transmitter power amplifier output is at the maximum possible level while still operating in the linear region of operation thereby maximizing the RF transmitter power amplifier efficiency, the adjusting means comprising:
  means for applying an input signal, at a level where the RF transmitter power amplifier output is linear;
  means for increasing the level of the input signal and monitoring the RF transmitter power amplifier output;
  first determining means for determining when the RF transmitter power amplifier output starts to become non-linear;
  second determining means for determining the input signal level corresponding to when the RF transmitter power amplifier output starts to become non-linear; and, means for controlling the input signal to maintain its maximum level at the input signal level corresponding to when the RF transmitter power amplifier output starts to become non-linear.

20. A radio having an RF transmitter power amplifier, the power amplifier having an input, an output, a linear region of operation, and a non-linear region of operation, a negative feedback path connecting the amplifier output to a first input of a summing device, the output of the summing device coupled to the amplifier input, and adjusting means for adjusting the amplifier input signal level so the amplifier output is at the maximum possible level while still operating in the linear region of operation, the adjusting means comprising:

means for applying a signal to a second input of the summing device, at a level where the amplifier operates in the linear region;

means for increasing the input signal level, while monitoring the voltage at the amplifier input;

first determining means for determining when the amplifier output starts to become non-linear;

second determining means for determining the input signal level corresponding to when the amplifier output starts to become non-linear;

means for controlling the input signal to maintain its maximum level at the input signal level corresponding to when the amplifier output starts to become non-linear.

21. The radio of claim 20 where the increasing means includes a ramp generator.

22. The radio of claim 20 where the first determining means includes a voltage comparator.

23. The radio of claim 20 where the second determining means includes a sample and hold device.

24. The radio of claim 20 where the controlling means includes a step attenuator.

25. A radio having an RF transmitter power amplifier, the power amplifier having an input, an output, a linear region of operation, and a non-linear region of operation, a negative feedback path connecting the amplifier output to a first input of a summing device, the output of the summing device coupled to the amplifier input, and adjusting means for adjusting the amplifier input signal level so the amplifier output is at the maximum possible level while still operating in the linear region of operation, the adjusting means comprising:

means for applying a signal to a second input of the summing device, at a level where the amplifier operates in the linear region;

means for increasing the input signal level, while monitoring the slope (dv/dt) of the voltage at the amplifier input;

means for determining when the slope at the amplifier input equals a predetermined value, the predetermined value corresponding to when the amplifier output starts to become non-linear;

means for determining the input signal level corresponding to when the slope at the amplifier input equals a predetermined value;

means for controlling the input signal to maintain its maximum level at the input signal level corresponding to when the slope at the amplifier input equals a predetermined value.

* * * * *